(12) United States Patent
McLaughlin et al.

(10) Patent No.: US 10,038,472 B2
(45) Date of Patent: Jul. 31, 2018

(54) RECEIVER FOR USE IN AN ULTRA-WIDEBAND COMMUNICATION SYSTEM

(71) Applicants: Michael McLaughlin, Dublin (IE); Ciaran McElroy, Dublin (IE); Sinbad Wilmot, Dublin (IE); Tony Proudfoot, Dublin (IE)

(72) Inventors: Michael McLaughlin, Dublin (IE); Ciaran McElroy, Dublin (IE); Sinbad Wilmot, Dublin (IE); Tony Proudfoot, Dublin (IE)

(73) Assignee: Decawave Limited, Dublin (IE)

( * ) Notice: Subject to any disclaimer, the term of this patent is extended or adjusted under 35 U.S.C. 154(b) by 0 days.

(21) Appl. No.: 14/157,003

(22) Filed: Jan. 16, 2014

(65) Prior Publication Data

US 2014/0133522 A1 May 15, 2014

Related U.S. Application Data

(60) Division of application No. 13/775,282, filed on Feb. 25, 2013, now Pat. No. 8,760,334, which is a
(Continued)

(51) Int. Cl.
| | |
|---|---|
| *H04B 1/7097* | (2011.01) |
| *H04B 1/7073* | (2011.01) |
| *H04B 1/709* | (2011.01) |
| *H04B 1/7163* | (2011.01) |
| *G06F 17/15* | (2006.01) |
| *H03D 3/00* | (2006.01) |
| *H04L 27/38* | (2006.01) |

(52) U.S. Cl.
CPC .......... *H04B 1/7097* (2013.01); *H04B 1/709* (2013.01); *H04B 1/7073* (2013.01); *H04B 1/71637* (2013.01); *G06F 17/15* (2013.01); *H03D 3/00* (2013.01); *H04L 27/38* (2013.01)

(58) Field of Classification Search
None
See application file for complete search history.

(56) References Cited

U.S. PATENT DOCUMENTS

| | | | | |
|---|---|---|---|---|
| 6,041,339 A | * | 3/2000 | Yu | H03H 17/0664 708/313 |
| 2008/0049871 A1 | * | 2/2008 | Yang | H04L 25/03057 375/316 |

OTHER PUBLICATIONS

Parthusceva, "The ParthusCeva Ultra Wideband PHY Proposal", IEEE P802.15 Working Group for WPAN, Mar. 2003.
(Continued)

*Primary Examiner* — Leon-Viet Nguyen
(74) *Attorney, Agent, or Firm* — Hunt Pennington Kumar & Dula, PLLC; Artie Pennington; Jeffrey Van Myers

(57) ABSTRACT

In an ultra-wideband ("UWB") receiver, a received UWB signal is periodically digitized as a series of ternary samples. The samples are continuously correlated with a predetermined preamble sequence to develop a correlation value. When the value exceeds a predetermined threshold, indicating that the preamble sequence is being received, estimates of the channel impulse response ("CIR") are developed. When a start-of-frame delimiter ("SFD") is detected, the best CIR estimate is provided to a channel matched filter ("CMF") substantially to filter channel-injected noise.

2 Claims, 14 Drawing Sheets

Related U.S. Application Data continuation-in-part of application No. 13/033,098, filed on Feb. 23, 2011, now Pat. No. 8,436,758, which is a continuation-in-part of application No. 12/885,517, filed on Sep. 19, 2010, now Pat. No. 8,437,432.

(60) Provisional application No. 61/316,299, filed on Mar. 22, 2010.

(56) References Cited

OTHER PUBLICATIONS

Amoroso, "Adaptive A/D Converter to Suppress CW Interference in DSPN Spread-Spectrum Communications", IEEE Trans. on Comm., vol. COM-31, No. 10, Oct. 1983, pp. 1117-1123.
Carr, "A Visit to Computation Centers in the Soviet Union," Comm. of the ACM, 1959, pp. 8-20.
Ware, "Soviet Computer Technology—1959", Comm. of the ACM, 1960, pp. 131-166.

* cited by examiner

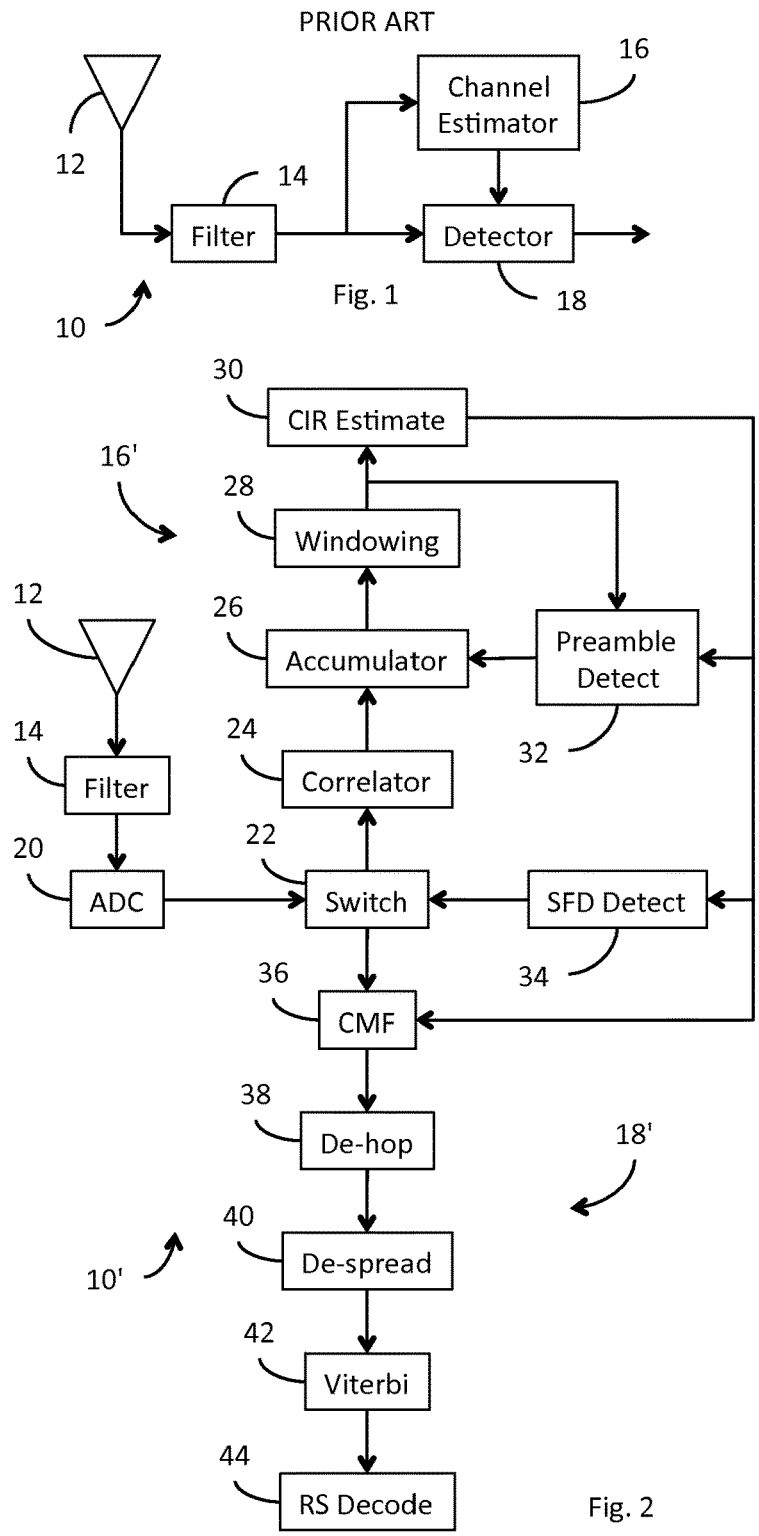

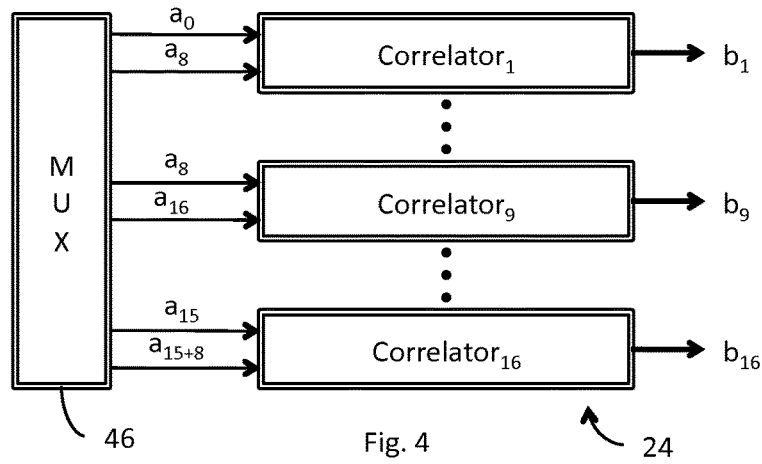
Fig. 4
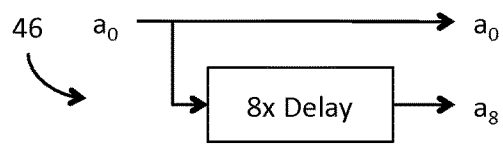
Fig. 5          Mux
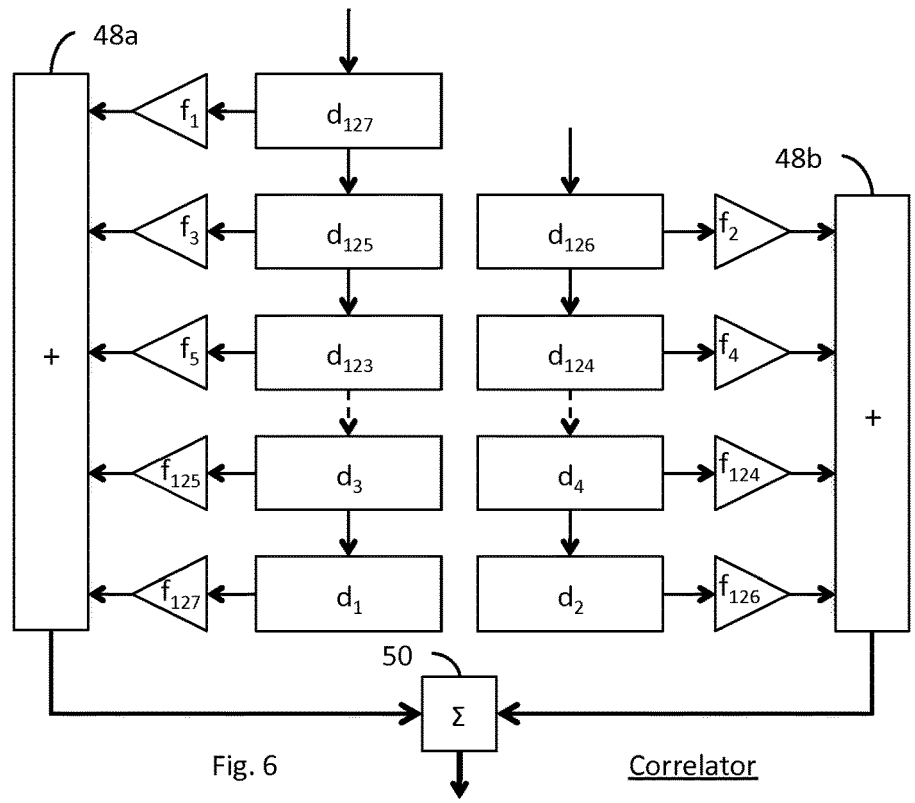
Fig. 6          Correlator

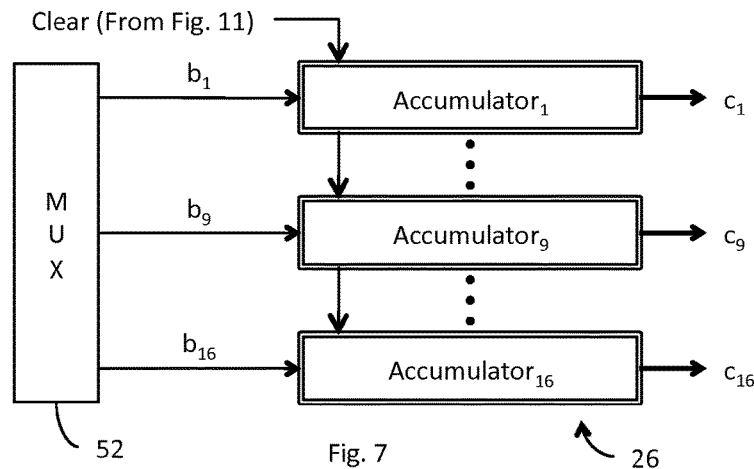
Fig. 7
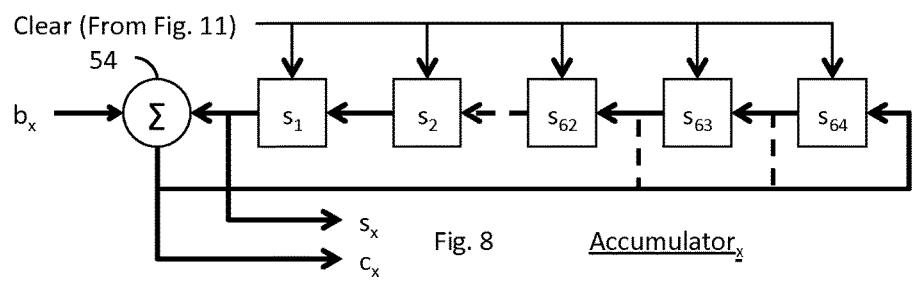
Fig. 8 Accumulator$_x$
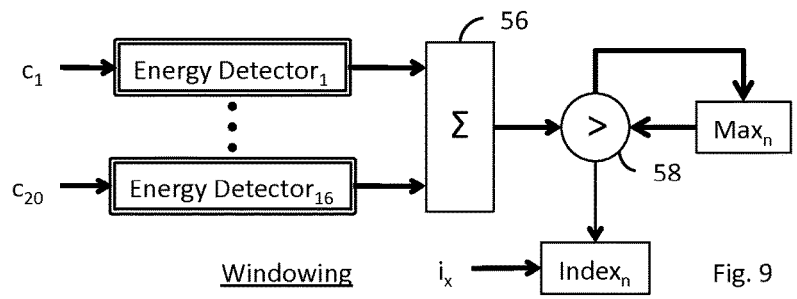
Windowing    Fig. 9
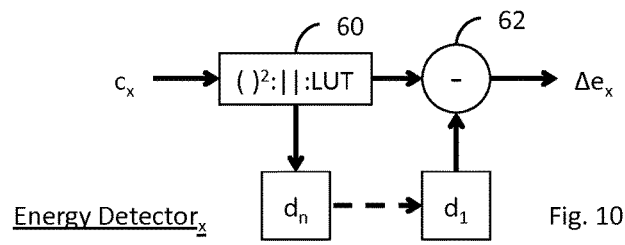
Energy Detector$_x$    Fig. 10

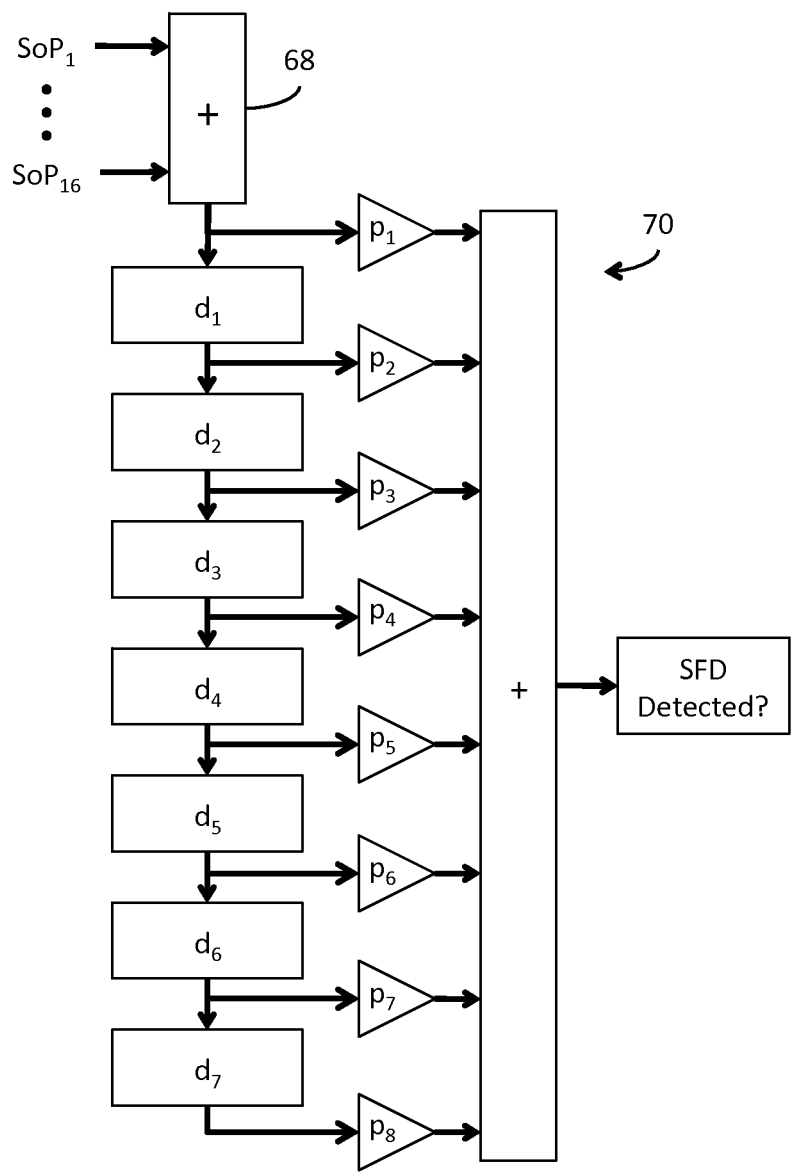
Fig. 13        SFD Detect 34

CIR Estimate

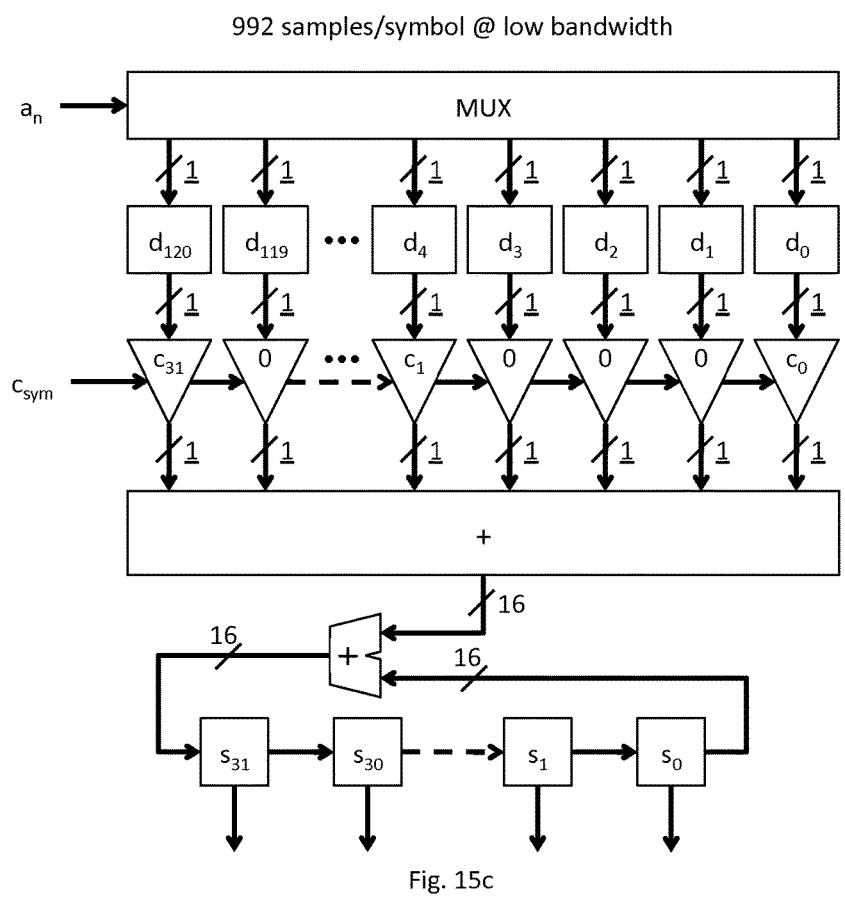
Fig. 15c
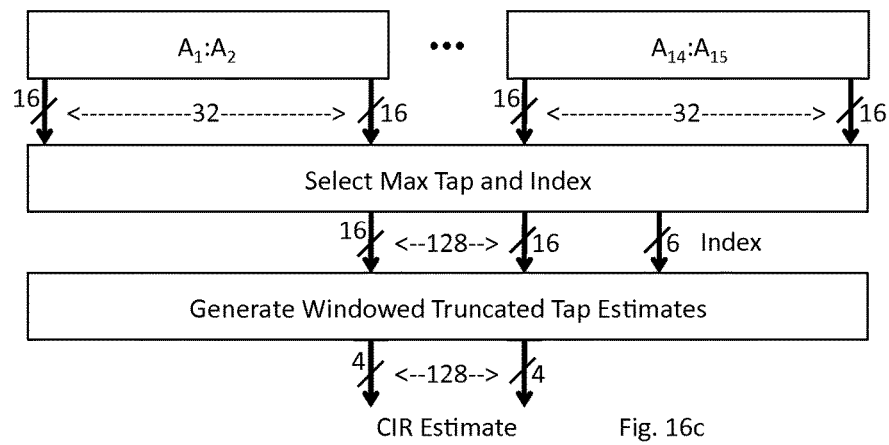
CIR Estimate    Fig. 16c

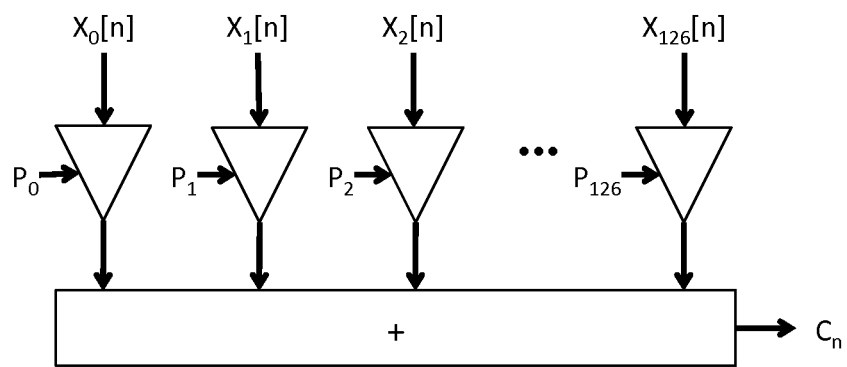
Flg. 21

RECEIVER FOR USE IN AN ULTRA-WIDEBAND COMMUNICATION SYSTEM

CROSS-REFERENCE TO RELATED APPLICATIONS

This application is a Division of application Ser. No. 13/775,282, filed 28 Mar. 2013 ("First Parent Application").

The First Parent Application is a Continuation-In-Part of application Ser. No. 13/033,098, filed 23 Feb. 2011 ("Second Parent Application"), which is in turn related to Provisional Application Ser. No. 61/316,299, filed 22 Mar. 2010 ("Parent Provisional").

The First Parent Application is also a Continuation-In-Part of application Ser. No. 12/885,517, filed 19 Sep. 2010, now U.S. Pat. No. 8,437,432, issued 7 May 2013 ("Parent Patent"), which is in turn also related to the Parent Provisional.

The subject matter of this Application is also related to the subject matter of PCT Application Serial No. PCT/EP2013/070851, filed 7 Oct. 2013 ("Related Application").

This application claims priority to:
1. The First Parent Application;
2. The Second Parent Application;
3. The Parent Patent;
4. The Parent Provisional; and
5. The Related Application;

collectively, "Related References", and hereby claims benefit of the filing dates thereof pursuant to 37 CFR § 1.78(a)(4).

The subject matter of the First and Second Parent Applications, the Parent Patent, the Parent Provisional, and the Related Application (collectively, "Related References"), each in its entirety, is expressly incorporated herein by reference.

BACKGROUND OF THE INVENTION

1. Field of the Invention

The present invention relates generally to ultra-wideband communication systems, and, in particular, to a receiver for use in an ultra-wideband communication system.

2. Description of the Related Art

In general, in the descriptions that follow, we will italicize the first occurrence of each special term of art which should be familiar to those skilled in the art of ultra-wideband ("UWB") communication systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

In general, in an ultra-wideband ("UWB") communication system, a series of special processing steps are performed by a UWB transmitter to prepare payload data for transmission via a packet-based UWB channel. Upon reception, a corresponding series of reversing steps are performed by a UWB receiver to recover the data payload. Details of both series of processing steps are fully described in IEEE Standards 802.15.4 ("802.15.4") and 802.15.4a ("802.15.4a"), copies of which are submitted herewith and which are expressly incorporated herein in their entirety by reference. As is known, these Standards describe required functions of both the transmit and receive portions of the system, but specify implementation details only of the transmit portion of the system, leaving to implementers the choice of how to implement the receive portion.

One or more of us have developed certain improvements for use in UWB communication systems, which improvements are fully described in the following pending applications or issued patents, all of which are expressly incorporated herein in their entirety:

"A Method and Apparatus for Generating Codewords", U.S. Pat. No. 7,787,544, issued 31 Jul. 2010;

"A Method and Apparatus for Generating Codewords", application Ser. No. 11/309,222, filed 13 Jul. 2006, now abandoned;

"A Method and Apparatus for Transmitting and Receiving Convolutionally Coded Data", U.S. Pat. No. 7,636,397, issued 22 Dec. 2009;

"A Method and Apparatus for Transmitting and Receiving Convolutionally Coded Data", application Ser. No. 12/590,124, filed 3 Nov. 2009, and the Issue Fee on which was paid on 11 Dec. 2012; and "Convolution Code for Use in a Communication System", application Ser. No. 13/092,146, filed 21 Apr. 2011.

One particular problem in multi-path, spread-spectrum systems, including UWB, is channel-induced noise present in the received signal. One common technique for significantly reducing the noise level relative to the receive level is to develop, during reception of a training sequence portion of the preamble of each transmitted packet, an estimate of the channel impulse response ("CIR"). Following detection in the received packet of the start-of-frame delimiter ("SFD"), the best CIR estimate is reversed in time and the complex conjugate is developed. This conjugate CIR estimate is thereafter convolved with the payload portion of the packet using a channel matched filter ("CMF"). Shown in FIG. 1 is a UWB receiver 10 adapted to operate in this manner. As is known, the signal received via an antenna 12 is continuously conditioned by a filter 14. During reception of the training sequence, channel estimator 16 develops from the conditioned signal the conjugate CIR estimate. During reception of the payload data, detector 18 employs a CMF (not shown) to convolve the conditioned signal with the conjugate CIR estimate, thereby significantly improving the signal-to-noise ratio ("SNR") and facilitating recovery of the payload data. See, also, "Efficient Back-End Channel Matched Filter (CMF)", U.S. Pat. No. 7,349,461, issued 25 Mar. 2008.

As noted in 802.15.4a, § 5.5.7.1, "UWB devices that have implemented optional ranging support are called ranging-capable devices (RDEVs)." (Emphasis in original.) For certain applications, such RDEVs are commonly implemented in the form of a relatively compact, autonomous radio-frequency identification ("RFID") tag or the like. Due to the small form factor and limited power supply, it is especially important to select circuit implementations that provide maximum performance at minimum power. Unfortunately, in known implementations of the UWB receiver, improvements in performance usually come at the expense of power. For example, it is known that a rake filter provides good performance in multi-path, spread-spectrum systems such as UWB. See, e.g., slide 21 of "The ParthusCeva Ultra Wideband PHY Proposal", *IEEE P802.15 Working Group for Wireless Personal Area Networks*, March 2003, a copy of which is submitted wherewith and which is expressly incorporated herein in its entirety by reference. However, known rake filter implementations tend to consume significantly more power than other prior art techniques.

While it has been proposed to implement the front-end of a spread-spectrum receiver using a fast, 1-bit analog-to-data converter ("ADC") to reduce the size (in terms of transistor count) of the convolution logic in both the CIR estimator and the CMF, such implementations are known to be particularly sensitive to continuous-wave ("CW") interference. This CW interference can be substantially rejected using a full 2-bit, sign+magnitude implementation such as that described by F. Amoroso in "Adaptive A/D Converter to Suppress CW Interference in DSPN Spread-Spectrum Communications", *IEEE Trans. on Communications*, vol. COM-31, No. 10, Oct. 1983, pp. 1117-1123 ("*Amoroso*83"), a copy of which is submitted wherewith and which is expressly incorporated herein in its entirety by reference. However, in such implementations, having dual representations of the 0-state, i.e., [−0, +0], tend to increase system entropy, resulting in less-than-optimal circuit/power efficiency.

We submit that what is needed is an improved method and apparatus for use in the receiver of a UWB communication system to filter channel-induced noise. In particular, we submit that such a method and apparatus should provide performance generally comparable to the best prior art techniques while requiring less circuitry and consuming less power than known implementations of such prior art techniques.

BRIEF SUMMARY OF THE INVENTION

In accordance with a preferred embodiment of our invention, we provide apparatus for use in an ultra-wideband (UWB) communication system in which multi-symbol packets are transmitted via a transmission channel, each transmitted packet comprising a multi-symbol data payload. In accordance with our invention, the apparatus comprises a trit-based ADC (see, e.g., our Related References) adapted to: periodically sample each received packet at a selected over-sample rate; and provide corresponding samples. Preferably, each sample comprising a selected one of: a sign bit having a first value indicative of the sample being positive, and a second value indicative of the sample being negative; or a single trit having a first value indicative of the sample being positive, a second value indicative of the sample being substantially zero, and a third value indicative of the sample being negative; or a sign bit and a magnitude bit, wherein the sign bit has a first value indicative of the sample being positive, and a second value indicative of the sample being negative; and the magnitude bit has a first value indicative of the sample being substantially zero, and a second value indicative of the sample being substantially non-zero. Our invention further includes a digital channel matched filter (CMF) adapted to receive a selected set of the samples, and to develop therefrom a multi-value result vector as a function of a best estimate of a channel impulse response (CIR) of the channel, the CIR estimate comprising a set of coefficients.

In one embodiment, the above apparatus is implemented as a receiver for use in a UWB communication system.

We also provide a method for operating a UWB communication system in which multi-symbol packets are transmitted via a transmission channel, each transmitted packet comprising a multi-symbol data payload. In accordance with our method, we analog-to-digital convert each transmitted packet by: periodically sampling each received packet at a selected over-sample rate; and provide corresponding samples. Preferably, each sample comprising a selected one of: a sign bit having a first value indicative of the sample being positive, and a second value indicative of the sample being negative; or a single trit having a first value indicative of the sample being positive, a second value indicative of the sample being substantially zero, and a third value indicative of the sample being negative; or a sign bit and a magnitude bit, wherein the sign bit has a first value indicative of the sample being positive, and a second value indicative of the sample being negative; and the magnitude bit has a first value indicative of the sample being substantially zero, and a second value indicative of the sample being substantially non-zero. Our method then digitally channel match filters a selected set of the samples, and develops therefrom a multi-value result vector as a function of a best estimate of a channel impulse response (CIR) of said channel, the CIR estimate comprising a set of coefficients.

In one embodiment, the above method is practiced in a receiver specially adapted for use in a UWB communication system.

In each of our embodiments, we prefer to employ ternary samples, but other sample sizes, including binary, may be employed in appropriate applications.

We submit that each of these embodiments of our invention filter channel-induced noise as effectively as any prior art method or apparatus now known to us, while consuming less power.

BRIEF DESCRIPTION OF THE SEVERAL VIEWS OF THE DRAWINGS

Our invention may be more fully understood by a description of certain preferred embodiments in conjunction with the attached drawings in which:

FIG. 1 illustrates, in block diagram form, a prior art receiver adapted for use in a UWB communication system;

FIG. 2 illustrates, in block diagram form, one embodiment of the receiver shown in FIG. 1, but constructed in accordance with our invention;

FIG. 4 illustrates, in block diagram form, a more detailed implementation of the correlator block shown in FIG. 2;

FIG. 5 illustrates, in block diagram form, a more detailed implementation of the multiplexor shown in FIG. 4;

FIG. 6 illustrates, in block diagram form, a more detailed implementation of each of the several correlators shown in FIG. 4;

FIG. 7 illustrates, in block diagram form, a more detailed implementation of the accumulator block shown in FIG. 2;

FIG. 8 illustrates, in block diagram form, a more detailed implementation of each of the several accumulators shown in FIG. 7;

FIG. 9 illustrates, in block diagram form, a more detailed implementation of the windowing block shown in FIG. 2;

FIG. 10 illustrates, in block diagram form, a more detailed implementation of each of the several energy detectors shown in FIG. 9;

FIG. 12, comprising

FIG. 13 illustrates, in block diagram form, a more detailed implementation of the SFD detection portion of the SFD detect block shown in FIG. 2;

FIG. 15, comprising FIG. 15a, FIG. 15b, FIG. 15c, and FIG. 15d, illustrates, in block diagram form, alternate, more detailed implementations of the correlator and accumulator blocks shown in FIG. 14;

FIG. 16, comprising FIG. 16a, FIG. 16b, FIG. 16c, and FIG. 16d, illustrates, in block diagram form, alternate, more detailed implementations of the windowing and CIR interpolation blocks shown in FIG. 14;

FIG. 21 illustrates, in block diagram form, a more detailed implementation of each of the several correlators shown in FIG. 20.

Figure 3:
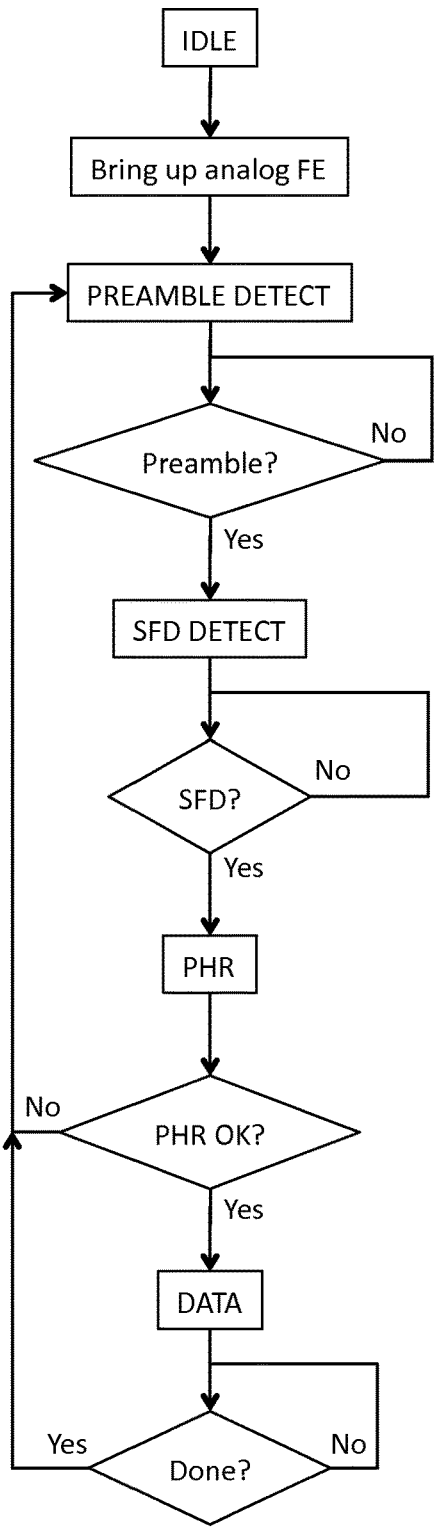
FIG. 3 illustrates, in flow diagram form, operation of the correlator block shown in FIG. 2.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Shown in FIG. 2 is a UWB receiver 10' constructed in accordance with our invention. As in the prior art system shown in FIG. 1, the signal received by antenna 12 is continuously conditioned by filter 14. The conditioned signal is then periodically sampled by an analog-to-digital converter ("ADC") 20 and provided as a continuous series of digital samples. In accordance with a preferred embodiment of our invention, ADC 20 is specially adapted to provide each digital sample in ternary form, i.e., [−1, 0, +1]. In view of the difficulty of currently available standard digital circuit technology efficiently to represent a 3-value variable in the form of a single ternary trit, we anticipate, at least in the near term, such variables will require representation using 2 conventional, binary bits, wherein a first one of the bits represents the numeric component of the variable, i.e., [0, 1], and the second bit represents the sign of the variable, i.e., [+, −]. In this regard, it could be argued that circuit technology has not progressed all that much since Soviet researchers built the first (perhaps only?) documented ternary-based computer systems. See, "*A Visit to Computation Centers in the Soviet Union*," Comm. of the ACM, 1959, pp. 8-20; and "*Soviet Computer Technology*—1959", Comm. of the ACM, 1960, pp. 131-166; copies of which are submitted herewith and which are expressly incorporated herein in their entirety by reference.

In the context of our invention, our trit can be distinguished from a conventional sign+magnitude implementation such as that described in Amoroso83, cited above. Consider the strategy for A/D conversion shown in FIG. 5 of Amoroso83; and, note, especially, that there are three separate and distinct switching thresholds: (i) a sign threshold $[T_0]$; (ii) a positive magnitude threshold $[T_0+\Delta]$; and (iii) a negative magnitude threshold $[T_0-\Delta]$. (See, also, Amoroso83, p. 1119, lines 21-24.) We have discovered that adapting the ADC to use ONLY a positive magnitude threshold $[T_0+\Delta]$ and a negative magnitude threshold $[T_0-\Delta]$ results in only a very small loss in resolution, while improving the performance of an impulse radio UWB receiver. Accordingly, in our preferred embodiment, ADC 20 implements only positive/negative magnitude thresholds $[T_0\pm\Delta]$, thereby simplifying the circuit while simultaneously improving both the conversion time of the ADC 20 and, in general, the performance of the receiver. Such an implementation lends itself naturally to our trit-based scheme, wherein the three defined states indicate, for example, that:

[−1]=> the input is below the negative magnitude threshold $[T_0-\Delta]$;

[0]=> the input is between the negative magnitude threshold $[T_0-\Delta]$ and the positive magnitude threshold $[T_0+\Delta]$; and

[+1]=> the input is above the positive magnitude threshold $[T_0+\Delta]$.

In contrast to a conventional sign+magnitude implementation, our trit-based ADC 20 can be readily adapted to operate either at a higher sample rate (improved performance but with more power) or at an equivalent sample rate (substantially equivalent performance but with less complexity, thereby reducing both circuit size and power consumption).

Upon power-on, a switch 22 will be configured to direct the trit sample stream to a correlator 24 portion of channel estimator 16'. In one embodiment, correlator 24 is adapted to correlate the sample stream with the known training sequence, and periodically to provide a partial finite impulse response ("FIR") for each symbol. An accumulator 26 is provided to accumulate the partial FIRs on a per-symbol basis for some or all of the symbols comprising the synchronization header ("SHR").

Windowing 28 is provided to selectively develop a CIR estimate based on a selected, sliding subset, i.e., window, of the accumulated per-symbol FIRs. When a sufficient number of per-symbol FIRs have been accumulated, windowing 28 develops an initial CIR estimate 30. In one embodiment, windowing 28 is adapted thereafter to periodically develop new CIR estimates as symbols slide through the window.

A preamble detect 32 correlates each new CIR estimate with the CIR estimate 30. In the event that preamble detect 32 determines that the new CIR estimate sufficiently resembles CIR estimate 30, then preamble detect 32 signals that the preamble has been detected. If, however, the new CIR estimate does not sufficiently resemble the CIR estimate 30, preamble detect 32 stores the new CIR estimate as CIR estimate 30. In one embodiment, preamble detect 32 is adapted to reset accumulator 26 each time a new CIR estimate 30 is stored, thereby facilitating development of the CIR estimate 30 using only trit samples from selected portions of the preamble of the received packet.

As is known, the predefined SFD code comprises a predetermined set of $N_{SFD}$ symbols. Once a predetermined minimum number of symbols have been received and continuing for each subsequent preamble symbol, an SFD detect 34 correlates the SFD detection code with the accumulated FIRs of the $N_{SFD}$ most recently received symbols. In one embodiment, SFD detect 34 is adapted to configure switch 22 so as to direct the trit sample stream to a CMF 36 portion of detector 18' when the SFD detection correlation exceeds a selected threshold, indicating that the full SHR has been received and the PHY header is immediately to follow.

In accordance with our invention, the CIR estimate 30 as of the moment of SFD detection comprises the best estimate of the impulse response of the channel. In one embodiment, windowing 28 is adapted to provide an index indicative of the portion of accumulator 26 upon which the final CIR estimate 30 was based. In effect, the index indicates the portion of the accumulator containing the most energy, which, in most cases, also contains the path with the highest energy, i.e., the peak path. In a ranging application, the portion of accumulator 26 immediately preceding the index can be analyzed, e.g., using interpolation, to identify the direct path.

In one embodiment, CMF 36 is adapted to correlate the received trit sample stream with the final, i.e., best, CIR estimate 30, thereby filtering the CIR noise from the sample stream. The filtered sample stream is then processed in a known manner by De-hop 38, De-spread 40, Viterbi 42 and Reed-Solomon ("RS") decode 44 to recover the data payload.

FIG. 3 illustrates, in flow diagram form, the general method of operation of the UWB receiver 10' illustrated in FIG. 2 as described above.

In one embodiment, correlator 24 may be implemented as a poly-phase correlator. For example, in a 500 MHz UWB system oversampled by 2 times the chip rate, the ADC sample rate must be 1000 MHz. Using a conventional single-phase correlator, the correlator must also run at 1000 MHz. However, if, as shown in FIG. 4, we employ 16 parallel correlators$_{[1:16]}$, each may now run at 62.5 MHz. For a spreading code of, say, length 127 (upsampled by 8 to give a preamble symbol length of 1016 samples), a mux 46 may be employed to selectively distribute the trit samples to each of the correlators$_{[1:16]}$; for a different spreading code, say, length 31 (upsampled by 32 to give a preamble symbol length of 992 samples), mux 46 is not necessary.

Various alternate embodiments will occur to those skilled in this art. For example, if, in the embodiment shown in FIG. 4, only 8 parallel correlators are implemented, each must now run at 125 MHz. In such an embodiment, the length 127 spreading code would still be upsampled by 8 to give a preamble symbol length of 1016 samples, whereas the length 31 spreading code would be upsampled by 32 to give a preamble symbol length of 992 samples. If, however, oversampling is performed at 4 times the chip rate, then it may be desirable to implement 32 parallel correlators, each now running at 62.5 MHz. In such an embodiment, the length 127 spreading code would be upsampled by 16 to give a preamble symbol length of 2032 samples, whereas the length 31 spreading code would be upsampled by 64 to give a preamble symbol length of 1984 samples. However, if only 16 parallel correlators are implemented, each must now run at 125 MHz. In this embodiment, the length 127 spreading code would still be upsampled by 16 to give a preamble symbol length of 2032 samples, whereas the length 31 spreading code would be upsampled by 64 to give a preamble symbol length of 1984 samples. Thus, it will be appreciated that the number of phases and the operating rates thereof can be varied to accommodate the desired operating characteristics of the UWB system.

In the embodiment illustrated in FIG. 4, and in each of the variants thereof described immediately above (as well as many others), mux 46 may be implemented using a delay line of appropriate length, as shown in FIG. 5.

In one embodiment, each of the correlators (see, FIG. 4) may be implemented as shown in FIG. 6. As illustrated, odd and even numbered trit samples received from mux 46 are sequentially staged through odd delay chain $d_{[1:127]}$ and even delay chain $d_{[2:126]}$, respectively. Periodically, the stored trit samples are multiplied in parallel by respective phase-specific coefficients via multipliers $f_{[1:127]}$. As is known, the coefficients are related to the known preamble sequence. In accordance with our invention, these coefficients will have one of 3 values: [−1, 0, +1]. Accordingly, each of the multipliers $f_{[1:127]}$ may be of simple form. Accumulators 48a and 48b sum the partial products developed by multipliers $f_{[1:127]}$, and a summer 50 develops the full correlator output.

In one embodiment, accumulator 26 may be implemented as a poly-phase accumulator. For example, as illustrated in FIG. 7, for cooperation with the embodiment of correlator 24 shown in FIG. 4, accumulator 26 may be implemented as a corresponding number of parallel accumulators$_{[1:16]}$, each operating at the same frequency as the correlators$_{[1:16]}$. A mux 52 may be employed to selectively distribute the FIR estimates developed by correlators$_{[1:16]}$ to each of the accumulators$_{[1:16]}$.

In one embodiment, each of the accumulators (see, FIG. 7) may be implemented as shown in FIG. 8. As illustrated, as FIR estimates, $b_x$, are periodically received from mux 52, summer 54 develops a summation, which is then recirculated through a 64-element delay chain $s_{[1:64]}$ back to summer 54, thereby allowing the summer 54 to continuously develop a partial CIR estimate, $c_x$.

We have noted that, in many cases, the accumulator is significantly longer than the CMF requires to perform its function. One option to reduce the length of the CIR estimate is to implement a windowing mechanism adapted to identify the portion of the accumulator having the greatest energy. In the embodiment illustrated in FIG. 9, we have included windowing 28, wherein each of the partial CIR estimates, $c_x$, is applied to a respective one of a plurality of energy detectors$_{[1:x]}$. A summer 56 periodically develops a summation of the detected energy, and, if the sum is greater than a previously stored maximum, $Max_n$, a comparator 58 will replace the previously stored maximum with the current sum; simultaneously, the current sample index, $i_x$, will be stored as $Index_n$. In accordance with our invention, $Index_n$ always indicates the position in the received sample stream at which the detected energy attained $Max_n$.

In one embodiment, each of the energy detectors$_{[1:x]}$ may be implemented as illustrated in FIG. 10. In accordance with our invention, a calculator 60 periodically develops an estimate, $e_x$, of the energy detected in the most recent CIR estimate, each of which is then forwarded to a subtractor 62 for accumulation. Simultaneously, each estimate, $e_x$, is forwarded via an n-element delay chain, $d_{[1:n]}$, to subtractor 62 for subtraction from the current accumulation. Thus, the accumulated change in detected energy, $\Delta e_x$, represents the detected energy measured over the n most-recently-received CIR estimates. As illustrated in FIG. 10, calculator 60 can be adapted to develop the estimate, $e_x$, as a maximum sum of energies, $(\ )^2$, or as a maximum sum of magnitudes, $|\ |$. Whereas the maximum sum of energies may be appropriate for detecting both the preamble and the SFD, the required squaring operation may be expensive to implement; one possible alternative is to implement this function as a look-up table ("LUT"). A third possible approach may be to develop each estimate, $e_x$, using peak path loss windowing; this approach may be particularly advantageous for direct path detection.

Figure 11:
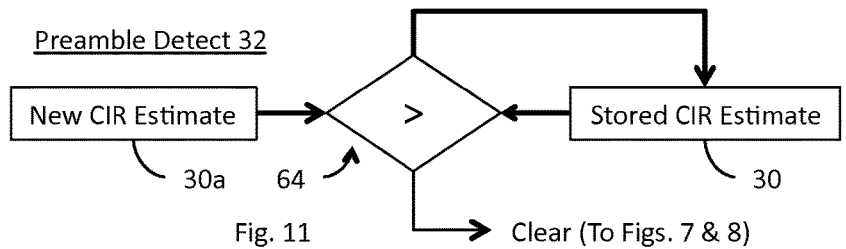
FIG. 11 illustrates, in block diagram form, a more detailed implementation of the preamble detect block shown in FIG. 2.

In one embodiment, preamble detect 32 may be implemented as illustrated in FIG. 11. In accordance with our invention, preamble detect 32 is adapted to develop a new CIR estimate 30a over a sliding window comprising a predetermined number, say, 8, of the most-recently-received preamble symbols. A correlator 64 periodically computes the scalar product of the new CIR estimate 30a with the conjugate of a stored prior CIR estimate 30. If the resultant scalar product determines the new CIR estimate 30a insufficiently resembles the stored CIR estimate 30, the new CIR estimate 30a is stored. This process is repeated only until the correlation first exceeds a predetermined resemblance threshold selected to correspond to a sufficiently good correlation between the two consecutive CIR estimates. As would be expected, the index, Index, corresponding to the stored CIR estimate is also stored (see, FIG. 9), thereby facilitating identification of the start of the preamble in the received sample stream.

In one embodiment, the preamble detect 32 can be adapted to determine CIR estimate resemblance in a manner similar to the following pseudocode algorithm:

```
[Pcode 1] DECLARE:
    $vAcc; // accumulator (complex vector of length 1024)
    $vCor; // correlation (complex vector of length 1024)
    $i; // FOR loop index (integer)
    $j; // WHILE loop index (integer)
    $rResemblance; // measure of the resemblance of two
        channel estimates (real)
    $vSaved; // saved 128 biggest accumulator samples
        (complex vector of length 128)
    $rThreshold; // resemblance threshold (real)
    $iWindow; // start of window index (integer)
START;
    // Get a first crude estimate of the channel:
    // Note this will only be a channel estimate if a
        preamble is being received.
    FOR ($i = 1; $i <= 8; $i++)
    {
        $vCor = Correlation of received signal with reference
            preamble sequence;
        $vAcc += $vCor;
        $i++;
    }
    $j = 0; // initialize WHILE
    WHILE ($j === 0)
    {
        $vSaved = Window the accumulator to find sequence of
            128 biggest samples; // Save the windowed portion of
            $vAcc
        $iWindow = index of start of window;
        // Get a second crude estimate of the channel:
        // Note this will only be a channel estimate if a
            preamble is being received.
        $vAcc = 0;
        FOR ($i = 1; $i <= 8; $i++)
        {
            $vCor = Correlation of received signal with
                reference preamble sequence;
            $vAcc += $vCor;
            $i++;
        }
        Core $vAcc; // core the accumulator
        $rResemblance = 0.0;
        FOR ($i = 1; $i <= 128; $i++)
        {
            $rResemblance += $vSaved[$i] × $vAcc[$i +
                $iWindow]*; // * denotes complex conjugate
            $i++;
        }
```

```
        IF ($rResemblance_{real} > $rThreshold)
        {
            $j = 1; // end WHILE
        }
    }
    Flag that Preamble has been detected;
END;
```

In the foregoing pseudocode algorithm, we have proposed that the accumulator be cored before the resemblance threshold is applied. As is known, coring is a technique adapted to reduce noise falling below a predetermined threshold. In this embodiment, we propose to apply a coring threshold proportional to the standard deviation of the noise in the accumulator, $\sigma_{noise}$. We choose to assume that the signal is corrupted by additive white Gaussian noise ("AWGN"):

$$\sigma_{noise} = \sqrt{N_{acc} 2 \sigma_{corr}^2}$$

where:
N=Number of accumulated symbols; and
$\sigma_{corr}^2$=Variance of the correlator output.

In this embodiment, the correlator output variance is a function of the number of non-zero values in the preamble code and the probability of a non-zero in the ADC output:

$$\sigma_{corr}^2 = N_{nz} P_{nz}$$

where:
$N_{nz}$=No. non-zeros in preamble code; and
$P_{nz}$=Probability of a non-zero in ADC output.

For a 1-bit ADC, $P_{nz}=1$, and, for a 1.5-bit ADC, $P_{nz}$ depends on the gain in the adaption algorithm, but it will typically be ⅓.

For a preamble detection algorithm that accumulates 8 symbols before comparing with the previous 8 accumulated symbols ($N_{acc}=8$), and assuming that the coring threshold is twice the standard deviation of the noise, the coring threshold can be determined as follows:

TABLE 1

Example coring thresholds for preamble detection.

| Preamble Code Length | $N_{nz}$ | ADC Bits | $P_{nz}$ | $\sigma^2_{corr}$ | $\sigma_{noise}$ | Coring threshold |
|---|---|---|---|---|---|---|
| 31 | 16 | 1 | 1 | 16 | 16 | 32 |
| 31 | 16 | 1.5 | 1/3 | 16/3 | 9.2 | 18.4 |
| 127 | 64 | 1 | 1 | 64 | 32 | 64 |
| 127 | 64 | 1.5 | 1/3 | 64/3 | 18.5 | 37 |

In general, we recommend that coring be done any time the channel estimate is used for something, including:
  During preamble detection, just before correlating the two noisy channel estimates to see how similar they are (e.g., as described above);
  After preamble reception, just before transferring the CIR to the CMF; and
  Just before interpolating the first paths in the channel estimate to find the peak of the leading path.
Note that the best coring threshold to use in each of these circumstances will usually be different.

Figure 12A:
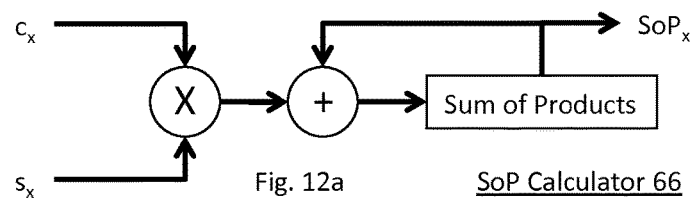
FIG. 12a, FIG. 12b, and FIG. 12c, illustrates, in block diagram form, alternate, more detailed implementations of the sum-of-products portion of the SFD detect block shown in FIG. 2.
Figure 12B:
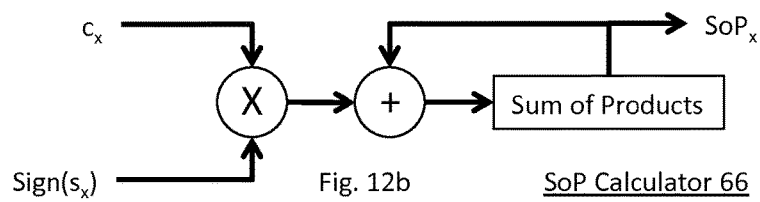
Figure 12C:
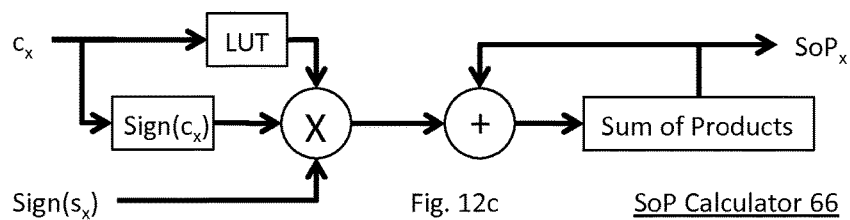

In one embodiment, as illustrated in FIG. 12 and FIG. 13, SFD detect 34 may be implemented as a sum-of-products ("SoP") calculator 66, an SoP adder 68 and windowing 70. As illustrated in FIG. 12a, each SoP calculator 66 may be adapted to develop the SoP by summing the product of a respective one of the CIR estimates, $c_x$, and the respective delayed FIR estimate, $s_x$ (see, FIG. 8). A simpler, but somewhat less effective, alternative is to develop the SoP as the sum of the CIR estimates, $c_x$, but wherein the signs of which are first modified by the sign of the respective delayed FIR estimate, $s_x$, as illustrated in FIG. 12b. A third approach, a hybrid of the embodiment shown in FIG. 12b but which should be more immune to noise effects, is illustrated in FIG. 12c, wherein each CIR estimate, $c_x$, is first squared, e.g., using a suitable LUT. This square is then multiplied by the sign of the respective CIR estimate, $c_x$. Prior to summing, the sign of each square is modified by the sign of the respective delayed FIR estimate, $s_x$. In accordance with our invention, SFD detect 34 initiates operation only after the accumulators 26 have processed at least $N_{SFD}$ symbols, and, thereafter on a symbol-by-symbol basis, correlates the most-recently-received window of $N_{SFD}$ symbols with a predetermined code, $p_{[1:8]}$; when the correlation first exceeds a predetermined threshold, SFD detect 34 signals that the SFD has been detected. It can be shown that setting $p_{[1:8]}$ to be the SFD code itself, maximizes the correlation at the point when the SFD is received. It may be preferable, however, to select $p_{[1:8]}$ so as to maximize the difference between the correlation output at SFD detect time and the maximum correlation output before this, i.e., while receiving the first parts of the SFD; such $p_{[1:8]}$ can easily be found by an exhaustive search.

Figure 14:
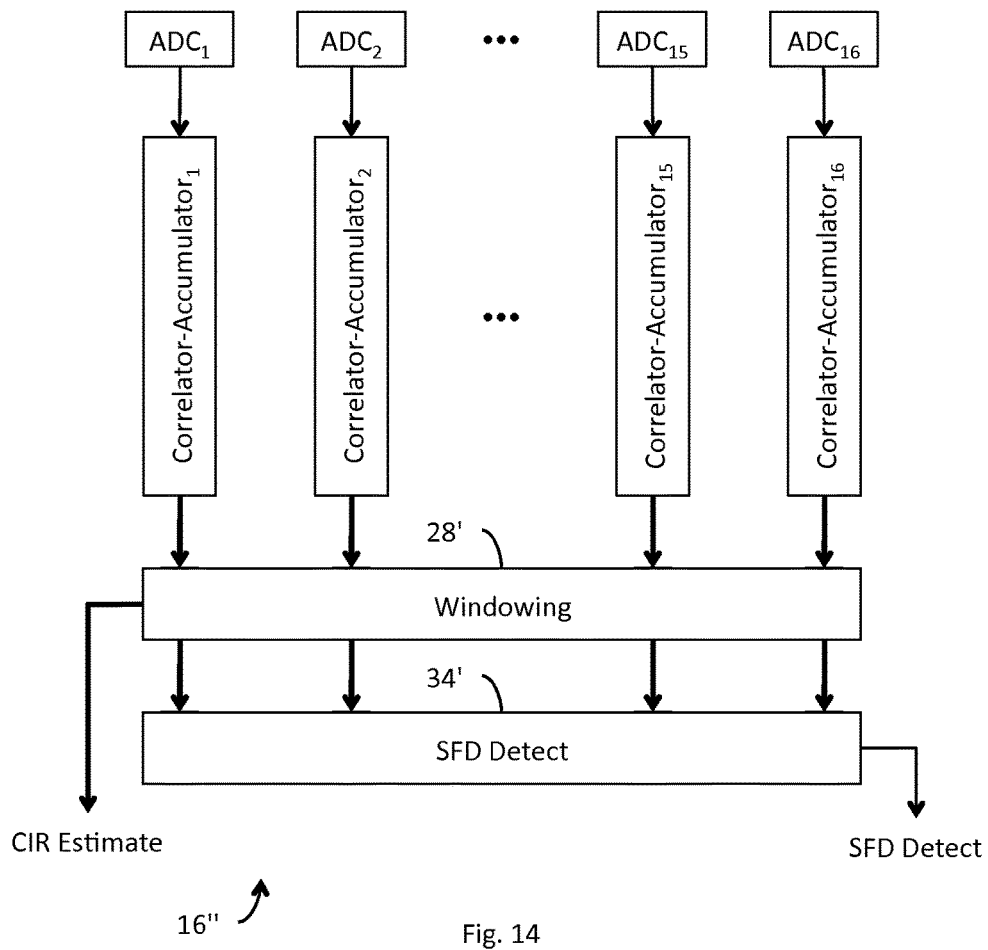
FIG. 14 illustrates, in block diagram form, an alternate embodiment of the receiver shown in FIG. 1, but constructed in accordance with our invention.

In one other embodiment, channel estimator 16" may be implemented as shown in FIG. 14. In this form, the trit input samples are developed periodically by a set of 16 $ADCs_{[1:16]}$, which, because they are connected in parallel, may be operated at a substantially lower clock rate than the single ADC of the embodiment shown in FIG. 2. Each of the trit sample streams is then used by a respective one of 16 correlator-accumulators$_{[1:16]}$ to develop partial FIR estimates. Windowing 28' develops the CIR estimate from a selected, sliding set of the partial FIR estimates. From the windowed partial FIR estimates, SFD detect 34' detects the SFD.

Figure 15A:
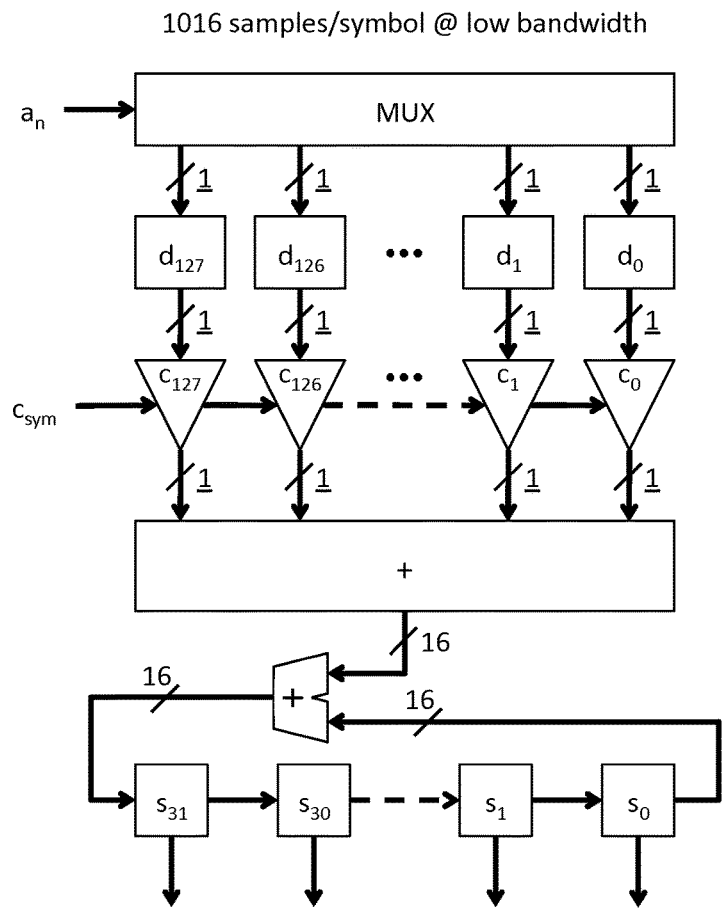
Figure 15B:
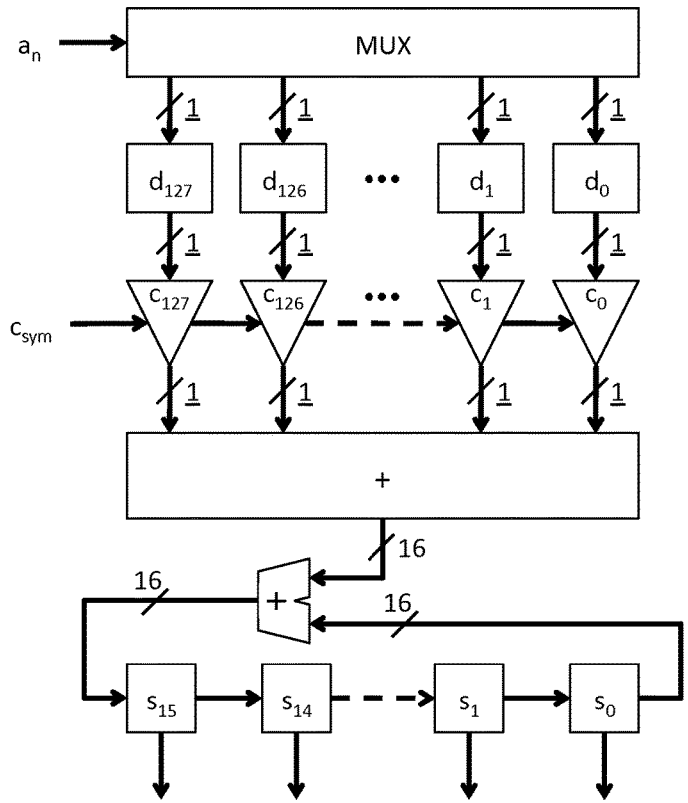
Figure 15D:
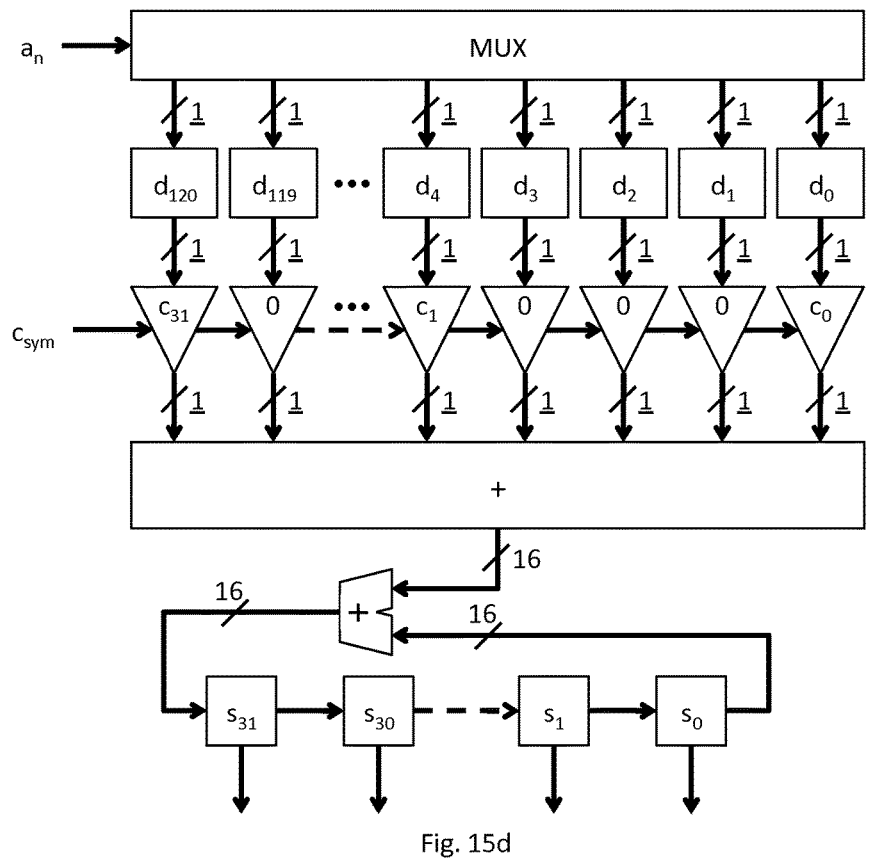

In one embodiment, variations of which are illustrated by way of example in FIG. 15, the accumulator portions of correlator-accumulators$_{[1:16]}$ may be implemented as 16 accumulators, $A_{[1:16]}$, each comprising 16 16-bit accumulators, which may be selectively configured as 16 parallel slices of 16 16-bit accumulators, $A_{[1]}:A_{[2]}-A_{[14]}:A_{[15]}$, in high-bandwidth mode or as 8 parallel slices of 32 16-bit accumulators, $A_{[1]}-A_{[15]}$, on low bandwidth mode. By way of example, FIG. 15a illustrates an implementation suitable for operating at relatively low bandwidth in a system wherein each symbol comprises 1016 samples, whereas FIG. 15b illustrates an implementation suitable for operating at a higher bandwidth wherein each symbol comprises 2032 samples. Similarly, FIG. 15c illustrates an implementation suitable for operating at relatively low bandwidth in a system wherein each symbol comprises 992 samples, whereas FIG. 15d illustrates an implementation suitable for operating at a higher bandwidth wherein each symbol comprises 1984 samples. In accordance with our invention, the illustrated embodiments are adapted to operate on trits, as indicated by the use of the symbol "1" in FIG. 15. As we did above, we indicate a single-trit delay element as $d_x$, a preamble symbol coefficient multiplier by $c_x$, and a multi-bit sample delay-chain element by $s_x$.

Figure 16A:
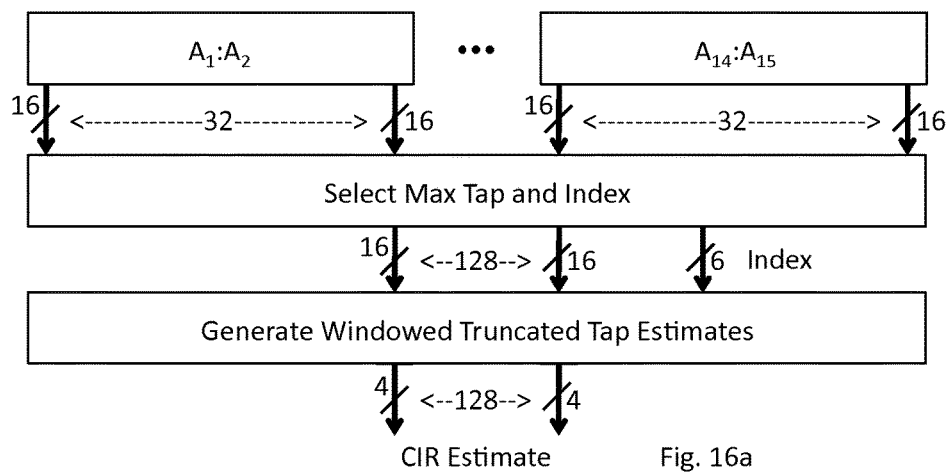
Figure 16B:
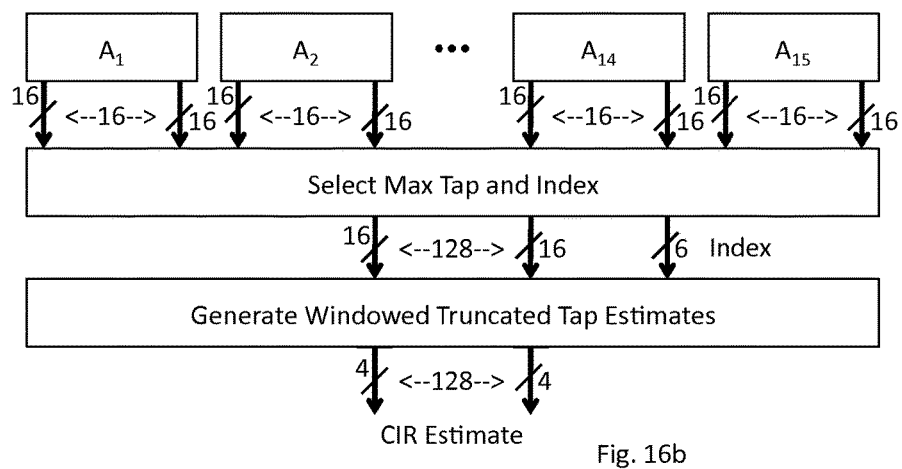
Figure 16D:
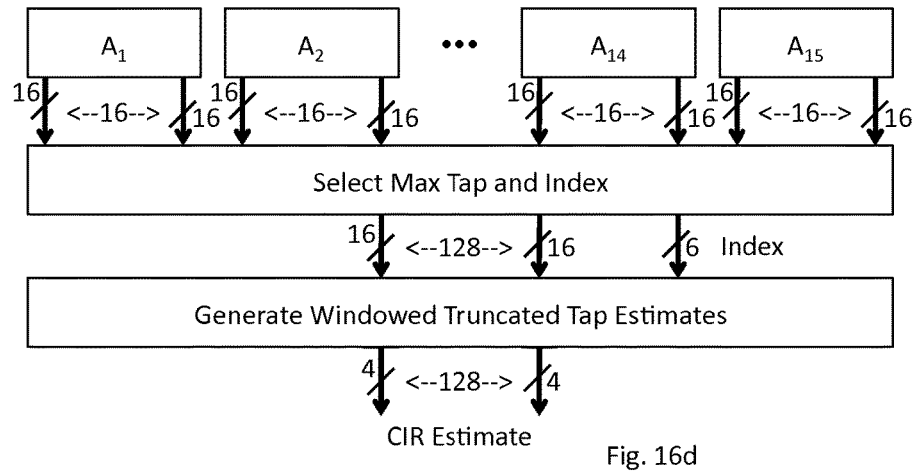

Alternative implementations of windowing 28' are illustrated in FIG. 16. In particular, FIG. 16a illustrates an implementation suitable for operating at relatively low bandwidth in a system wherein each symbol comprises 1016 samples, whereas FIG. 16b illustrates an implementation suitable for operating at a higher bandwidth wherein each symbol comprises 2032 samples. Similarly, FIG. 16c illustrates an implementation suitable for operating at relatively low bandwidth in a system wherein each symbol comprises 992 samples, whereas FIG. 16d illustrates an implementation suitable for operating at a higher bandwidth wherein each symbol comprises 1984 samples.

Figure 17:
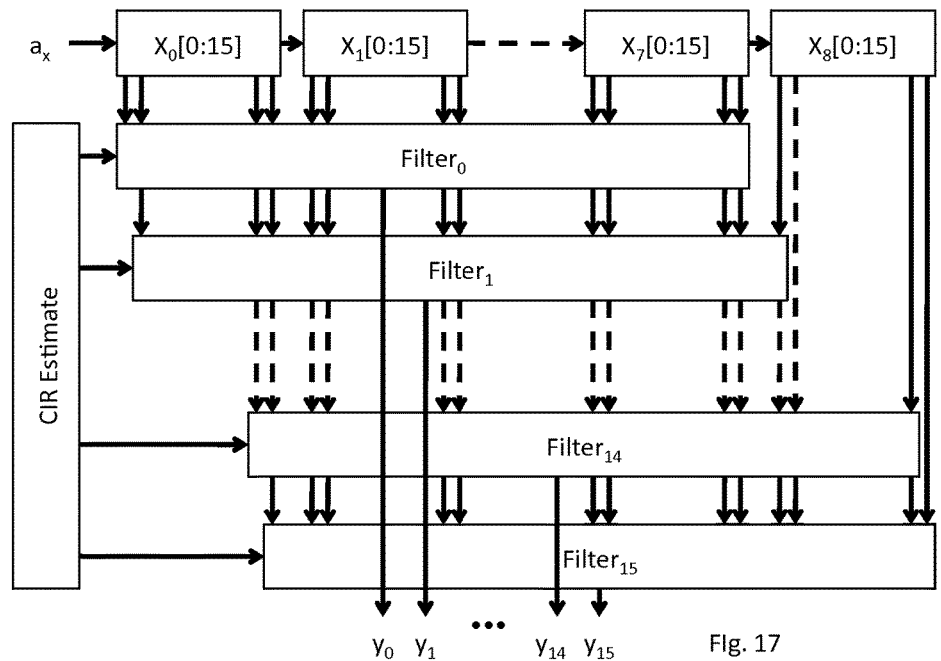
FIG. 17 illustrates, in block diagram form, a more detailed implementation of the CMF block shown in FIG. 2.

In one embodiment, CMF 36 may be implemented as a poly-phase channel matched filter. As noted above, in a 500 MHz UWB system oversampled by 2 times the chip rate, the ADC sample rate must be 1000 MHz. Using a conventional single-phase CMF, the CMF must also run at 1000 MHz. However, if, as shown in FIG. 17, we employ 16 parallel filters$_{[1:15]}$, each may now run at 62.5 MHz.

Since the SFD detect 34' will identify the SFD one or two symbols prior to the actual end of the SFD, CMF 36 will have sufficient time to load the CIR estimate into a CIR estimate block. By way of example, the CIR estimate block may comprise a long shift-register adapted to serially receive and store each of the CIR coefficient pairs. Following the end of the SFD, payload data bits, $a_x$, are continuously received and sequenced through a delay line comprising 9 16-bit delay elements, $X_{[0:8]}[0:15]$.

Figure 18:
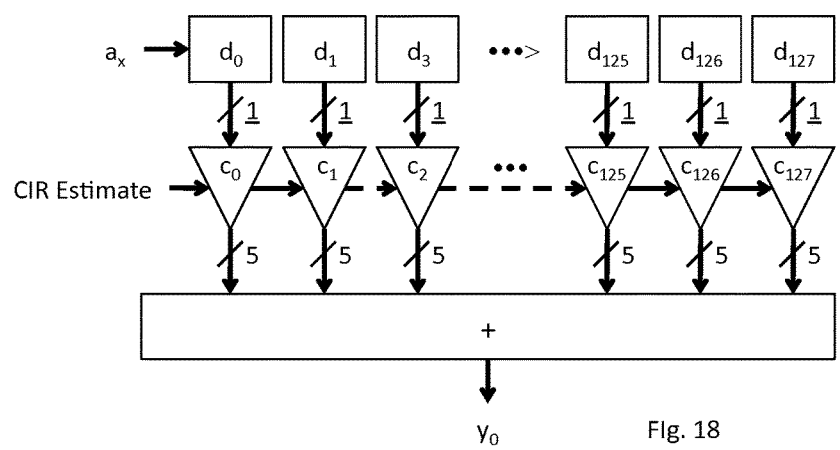
FIG. 18 illustrates, in block diagram form, a more detailed implementation of the CMF phase filter blocks shown in FIG. 17.

As shown in FIG. 18, each of the filters$_{[0:15]}$ comprises a 128-complex-sample delay line, $d_{[0:127]}$, each delay stage having a respective complex multiplier, $c_{[0:127]}$, and a summer. After each set of 16-samples of payload data, the multipliers in each filter develop, in parallel, respective 5-bit partial sums as a function of respective CIR coefficient pairs, and the summer develops a respective result vector value, $Y_{[0:15]}$, as a function of the resultant 128 partial sums. Although the summer may be implemented as a single, large carry-save adder ("CSA") (fast but relatively circuit intensive), our poly-phase implementation of the CMF 36 allows us to instantiate the summer as a hierarchy of smaller carry-propagate adders ("CPA") (slower but less circuit intensive). Preferably, after rounding, each result vector value, $Y_{[0:15]}$, comprises 5-bits.

In one other embodiment, as the real and imaginary CIR coefficient pairs are clocked into the CMF estimate block, it is possible to transform them into sum and difference terms, essentially pre-computing the results of the complex multiplication. These terms may then be stored in registers, thereby allowing the complete complex multiplication to be replaced by a single 9-way multiplexor, as shown in the following table:

| Dor | Doi | Result Real | Result Imaginary |
| --- | --- | --- | --- |
| −1 | −1 | −Cr + Ci | −Cr − Ci |
| −1 | 0 | −Cr | −Cr |
| −1 | 1 | −Cr − Ci | −Cr + Ci |
| 0 | −1 | Ci | −Ci |
| 0 | 0 | 0 | 0 |
| 0 | 1 | −Ci | Ci |
| 1 | −1 | Cr + Ci | Cr − Ci |
| 1 | 0 | Cr | Cr |
| 1 | 1 | Cr − Ci | Cr + Ci |

Figure 19:
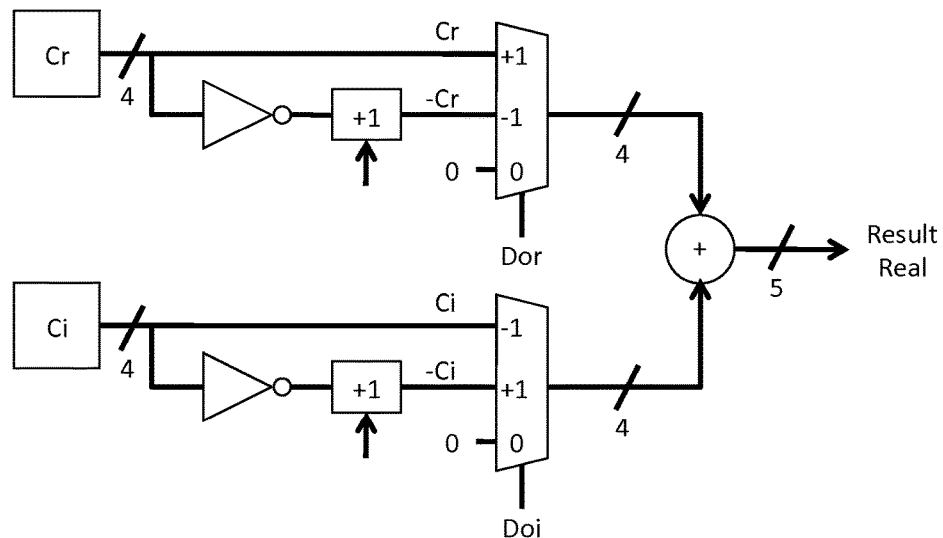
FIG. 19 illustrates, in schematic form, one exemplary implementation of the complex multipliers, $c_{[0:127]}$, within the CMF phase filter blocks shown in FIG. 18.

Alternatively, they can be computed dynamically; a circuit adapted to implement the real result portion of this function is shown by way of example in FIG. 19. As will be clear to those skilled in this art, the imaginary portion of this function can be readily implemented with identical circuitry by simply reversing the connections to the +1 and −1 inputs of the Ci mux. We expressly intend that the term multiplier, as used in this specification and the appended claims, include alternate embodiments that accomplish the desired multiplication function, including, for example, the multiplexor-based embodiment shown in FIG. 19. Indeed, those skilled in this art will readily recognize that our use of trit-based sampling greatly facilitates replacement of traditional high-complexity, time-critical, dynamic multiplication circuits with substantially lower-complexity, less time-critical multiplexor-based alternatives.

Figure 20:
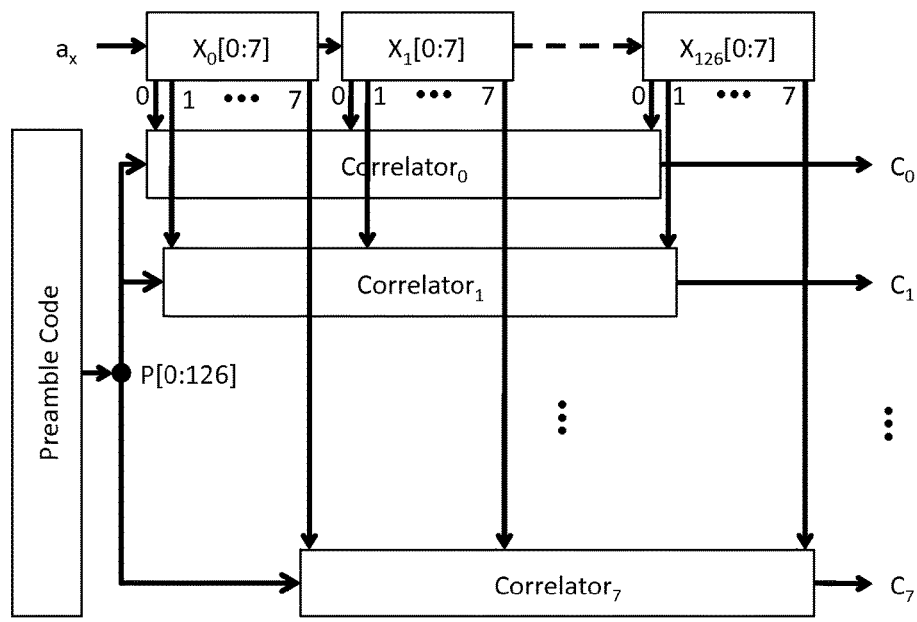
FIG. 20 illustrates, in block diagram form, an alternate embodiment of the correlator block shown in FIG. 2.

Shown in FIG. 20 is an alternate embodiment of the correlator block 24 of FIG. 2. In this embodiment, each of the polyphase correlators may be instantiated using the embodiment shown in FIG. 21. We believe that this alternate embodiment may provide benefits in some applications over the embodiments described above.

Although we have described our invention in the context of two alternative embodiments, one of ordinary skill in this art will readily realize that many modifications may be made in such embodiments to adapt either to specific implementations. By way of example, it will take but little effort to adapt our invention for use with a 1-bit ADC scheme when it can be anticipated that the target application will not be subject to significant levels of in-channel CW interference. Further, the several elements described above may be implemented using any of the various known semiconductor manufacturing methodologies, and, in general, be adapted so as to be operable under either hardware or software control or some combination thereof, as is known in this art.

Thus it is apparent that we have provided an improved method and apparatus for use in the receiver of a UWB communication system to filter channel-induced noise. In particular, we submit that our method and apparatus provides performance generally comparable to the best prior art techniques while requiring less circuitry and consuming less power than known implementations of such prior art techniques. Therefore, we intend that our invention encompass all such variations and modifications as fall within the scope of the appended claims.

What we claim is:

1. A method for use in an ultra-wideband (UWB) communication system in which multi-symbol packets are transmitted via a transmission channel, each transmitted packet comprising a synchronization header (SHR), the SHR comprising a plurality of preamble symbols, the method comprising the steps of:
   1.1. periodically developing digital samples of at least each preamble symbol of the SHR at a selected oversample rate;
   1.2. periodically selecting at a selected up-sample rate a set of the samples;
   1.3. developing from each of said sample sets a partial finite impulse response (FIR) of said channel to each preamble symbol;
   1.4. accumulating the partial FIRs for at least a selected subset of all preamble symbols;
   1.5. selectively coring the accumulated partial FIRs according to a predetermined coring function;
   1.6. developing from the cored partial FIRs for said selected subset of said preamble symbols a best estimate of a channel impulse response (CIR) comprising an impulse response of said channel;
   1.7. developing a first CIR estimate over a predetermined number of the most-recently-received preamble symbols;
   1.8. correlating the first CIR estimate with a stored second CIR estimate; and
   1.9. replacing the second CIR estimate with the first CIR estimate until the first CIR estimate sufficiently resembles the stored second CIR estimate.

2. The method of claim 1 wherein the coring function comprises a coring threshold proportional to a standard deviation of a noise component in the accumulated partial FIRs.

* * * * *